United States Patent [19]

Groover, III

[11] Patent Number: 5,010,386
[45] Date of Patent: Apr. 23, 1991

[54] INSULATOR SEPARATED VERTICAL CMOS
[75] Inventor: Robert Groover, III, Dallas, Tex.
[73] Assignee: Texas Instruments Incorporated, Dallas, Tex.
[21] Appl. No.: 457,030
[22] Filed: Dec. 26, 1989
[51] Int. Cl.[5] .................. H01L 27/02; H01L 29/06; H01L 29/10; H01L 27/01
[52] U.S. Cl. .......................... 357/42; 357/41; 357/55; 357/23.4; 357/23.6; 357/23.7
[58] Field of Search .............. 357/42, 50, 41, 47, 357/49, 25, 41, 42, 55, 23.4, 23.6, 23.7

[56] References Cited
U.S. PATENT DOCUMENTS 4,450,466 5/1984 Nishizawa et al. ............... 357/50 X
4,740,826 4/1988 Chatterjee ........................ 357/42 X
4,810,906 3/1989 Shah et al. ....................... 357/42 X Primary Examiner—Rolf Hille
Assistant Examiner—Mahshid Saadat
Attorney, Agent, or Firm—Melvin Sharp; James T. Comfort; N. Rhys Merrett

[57] ABSTRACT

A complementary semiconductor structure comprises a substrate of a first conductivity type upon which a first channel layer of a second conductivity type is formed. The first source/drain layer of the first conductivity type is formed on the surface of the first channel layer and an insulating layer is formed on the surface of the first source/drain layer. A second source/drain layer of the second conductivity type is formed on the surface of the insulating layer and a second channel layer of said first conductivity is formed on the surface of the second source/drain layer. A third source/drain layer of the second conductivity type is formed on the surface of the second channel layer. Gate circuitry is vertically disposed on an edge perpendicular to the plane and adjacent to the first and second channel layers and insulated therefrom.

16 Claims, 4 Drawing Sheets

INSULATOR SEPARATED VERTICAL CMOS

TECHNICAL FIELD OF THE INVENTION

This invention relates in general to semiconductor circuits, and more particularly an insulator separated vertical CMOS structure.

BACKGROUND OF THE INVENTION

In semiconductor processing, it is sometimes easier to form vertical structures where the vertical dimensions can be accurately controlled. U.S. Pat. No. 4,740,826 to Chatterjee and U.S. Pat. No. 4,810,906 to Shah et.al., which are incorporated herein by reference, disclose integrated electronic devices wherein two vertical transistors are vertically aligned to form a CMOS inverter. Thus, a layer of P type material is formed on the surface of an N+ type substrate, followed by the formation of an N+ layer, a P+ layer, an N− layer, and a P+ layer. A trench is etched along one side of the stack and a connector is formed to the midlevel P+ and N+ layers. Another trench is formed and a gate insulator and a gate are formed therein. The gate serves as a gate for both the N-channel and P-channel transistors. The connector is used to provide an output from the connected source/drain regions of the two transistors. Thus, current flows vertically through a pair of complementary field effect transistors, which are always in series.

The concept disclosed in the above-referenced patents may be used to form CMOS inverters, and other structures, such as NOR gates, which comprise a plurality of inverters. Since the stacked transistors have connected source/drain regions, however, the formation of more complex logic elements using a similarly vertical configuration is difficult.

Therefore, a need has arisen to provide a stacked vertical transistor structure from which complex logic devices may be configured.

SUMMARY OF THE INVENTION

In accordance with the present invention, a complementary semiconductor device is provided which substantially eliminates the disadvantages and problems associated with prior vertical transistor devices.

The complementary semiconductor structure of the present invention comprises a substrate of the first conductivity type upon which a first channel layer of a second conductivity type is formed. A first source/drain layer of said first conductivity type is formed on the surface of the first channel layer. An insulating layer is formed on the surface of the first source/drain layer and a second source/drain layer of the second conductivity type is formed on the surface of the insulating layer. A second channel layer of a first conductivity type is formed on the surface of the second source/drain layer and a third source/drain layer of the second conductivity type is formed on the surface of the second channel layer. Gate circuitry is vertically disposed on an edge perpendicular to the plane and adjacent to the first and second channels layers and is insulated therefrom.

The complementary semiconductor device of the present invention provides several technical advantages. First, complex structures may be designed using the complementary structure, since the top and bottom transistors of each mesa are not connected and need not both be used. Second, the midlevel insulator provides processing control by providing an intermediate etch stop in the silicon etching steps such that the timed etch distance is cut in half. Third, in the embodiment when the N-channel transistor is provided at the surface of the device, the use of pseudo-NMOS structures in the circuit design is facilitated. Fourth, the structure is amendable to an efficient honeycomb layout which minimizes overall circuit size.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1-8 of the drawings, like numerals being used for like and corresponding parts of the various drawings.

Figure 1:
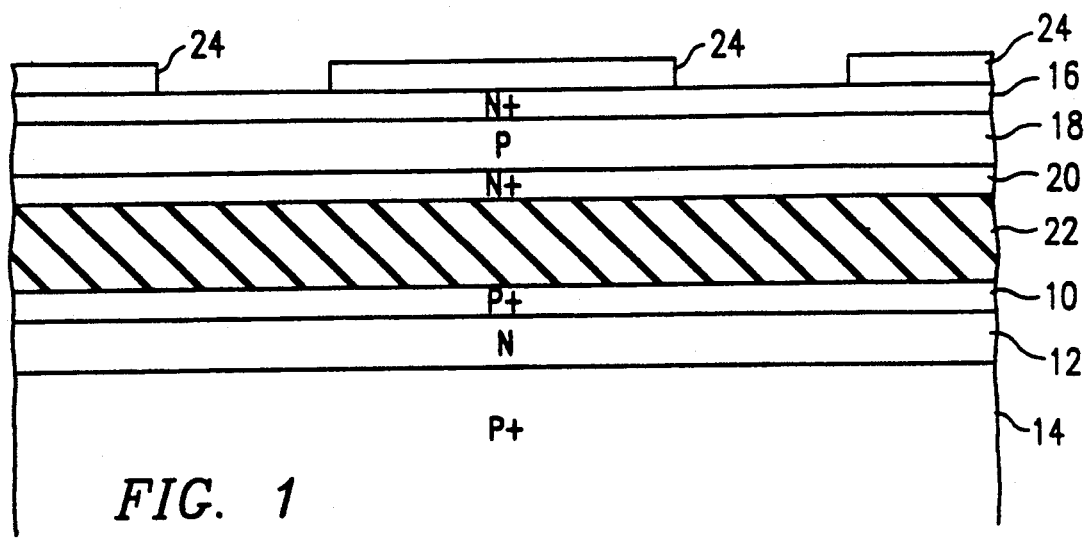
FIG. 1 illustrates a cross-sectional side view of the present invention after a first processing stage.

FIG. 1 illustrates a cross-sectional side view depicting the initial processing steps for fabricating one embodiment of the present invention. Doped layers 10 and 12 are formed on substrate 14. The doped layers 10 and 12 may be formed epitaxially (using, for example, molecular beam epitaxial techniques) or by implantation. By using these techniques, very abrupt transitions between the N and P type doping material may be fabricated. For example, P+ type layer 10 may be approximately 1,000-2,000 angstroms thick and the N type layer 12 may be 2,000-5,000 angstroms thick. Doped layers 16, 18 and 20 are separated from P+ type layer 10 by a thick oxide region 22. Layers 16 and 20 may be on the order of 1,000-2,000 angstroms and layer 18 may be on the order of 2,000-5,000 angstroms. Thinner or thicker layers may be formed as desired and are considered within the scope of the invention. The critical thickness involve layers 12 and 18, which are preferably within the ranges stated above. However, the thickness layers 12 and 18 may alternatively be selected to achieve any desired electrical gate length.

The midlevel insulator layer 22 can be formed using several methods. One such method uses oxide bonding, or other forms of wafer-to-wafer bonding, to join two slices face-to-face, followed by lapping and global etch back to an etch stop to thin the second slice such that the top semiconductor layers 16, 18 and 20 come from the second slice and the lower layers 10, 12, and 14 come from the first slice. This embodiment of the present invention provides the advantage of allowing a thick insulator layer 22, since the only cost of increased insulator thickness is increased etch and deposition times. A thick insulator layer 22 reduces parasitic capacitances and leakage through the insulator layer.

Alternatively, and less preferably, an implant and anneal process, such as the process used to make SOI structures, could be used before the formation of the layers 16, 18 and 20. This process could be performed at a much lower energy than that used for SOI structures. For example, a thick N− layer could be grown on the P+ substrate 14 (with appropriate precautions against autodoping). A second P type implant could be performed to form the midlevel P+ layer 10. An oxygen implant could then be performed at a dose of, for example, $1 \times 10^{15}$ cm$^{-2}$ of oxygen at a stopping distance of 200 angstroms. Epitaxial growth could then resume, using implantation techniques to form the midlevel N+ layer 20 and N+ layer 16.

After forming the layers 10, 12, 16, 18 and 20, a masking layer 24 is formed over layer 16. Masking layer 24 is formed of a suitable masking material and patterned using commonly known photolithographic techniques.

Figure 2:
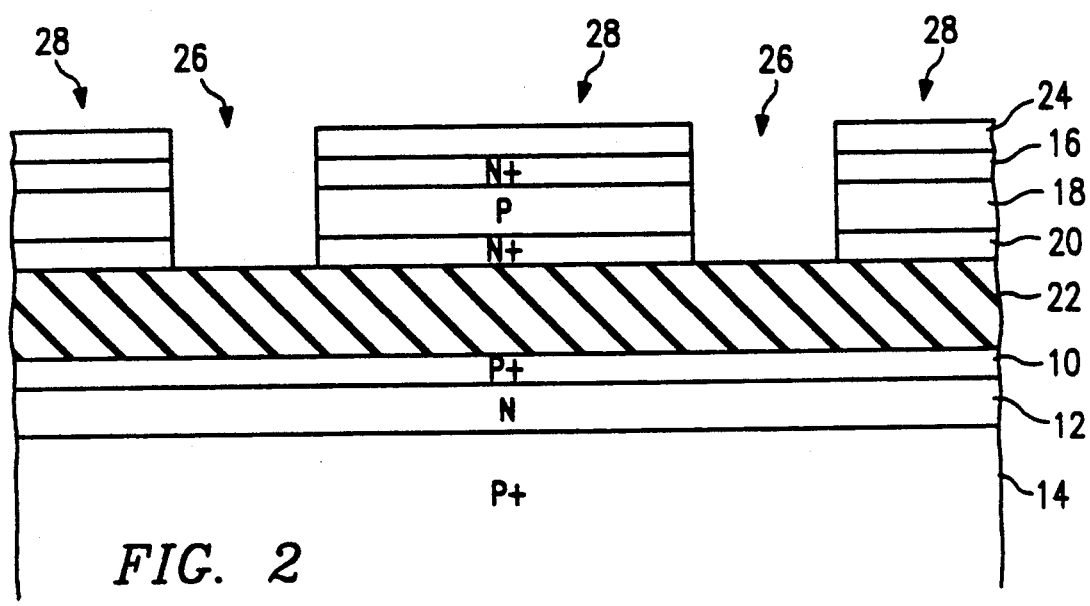
FIG. 2 illustrates a cross-sectional side view of the present invention after a second processing stage.

In FIG. 2, masking layer 24 is used during an etching process to fabricate trenches 26. The trenches 26 extend to surround mesas 28 of semiconductor material. In the preferred embodiment, illustrated in FIG. 2, the midlevel insulator 22 provides an effective etch stop which results in greater processing control.

Figure 3:
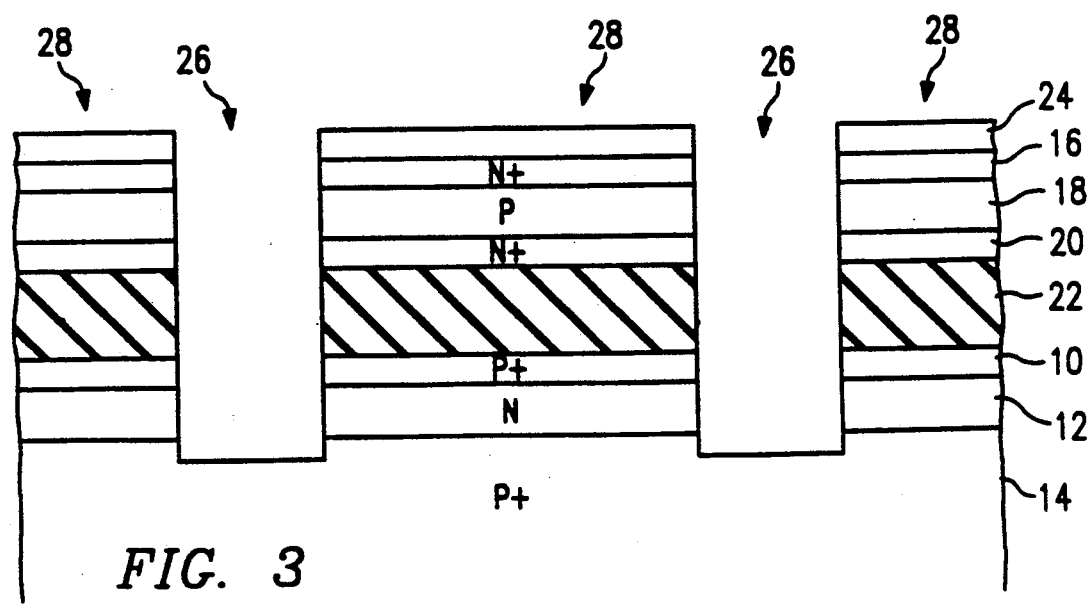
FIG. 3 illustrates a cross-sectional side view of the present invention after a third processing stage.

FIG. 3 illustrates a cross-sectional side view of the present invention after a third processing stage, in which the trenches 26 are completed. An oxide etching step which is selective to silicon is used to etch the portion of the trench through the midlevel insulator layer 22. Following the insulator etch, another silicon etch is used to etch the trench through the P+ type layer 10 and the N type layer 12, and partially into the substrate 14.

Figure 4:
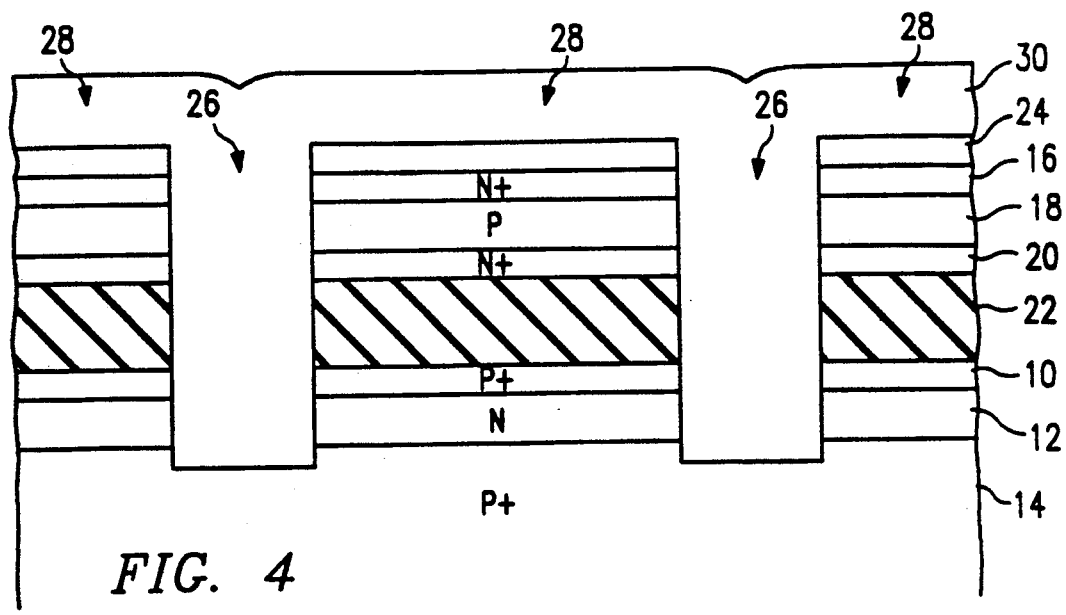
FIG. 4 illustrates a cross-sectional side view of the present invention after a fourth processing stage.

In FIG. 4, a cross-sectional side view of the present invention is illustrated after a fourth processing stage. A planarizing insulating layer 30, typically a silicon dioxide layer, is formed over the surface of the structure of FIG. 3 and into the trenches 26. The insulating layer can be formed, for example, by chemical vapor deposition.

Figure 5A:
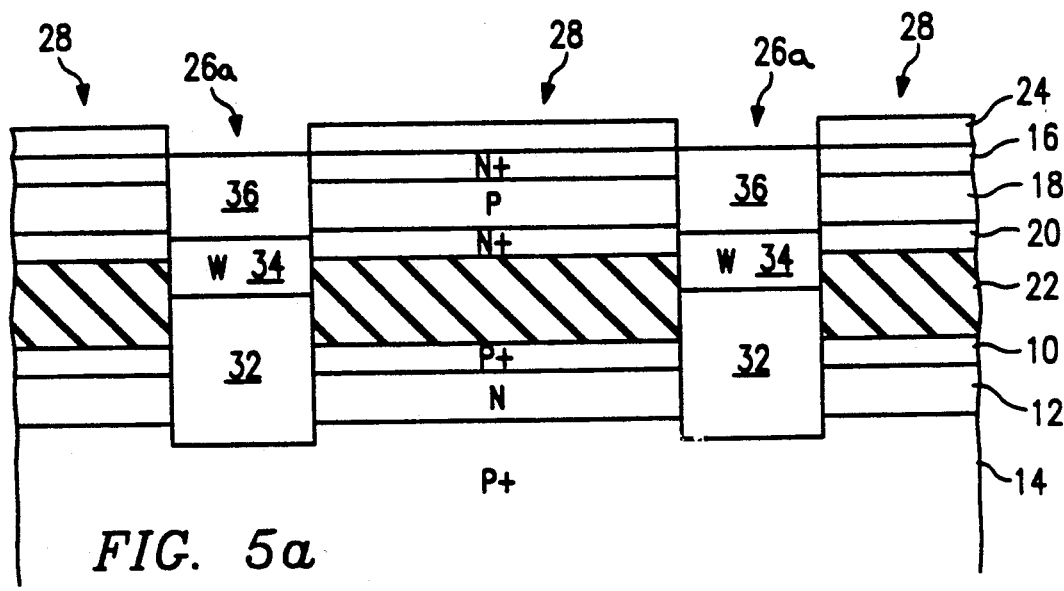
FIGS. 5a-c illustrate cross-sectional side views of the present invention showing various connections to the midlevel diffused regions after a fifth processing stage.
Figure 5B:
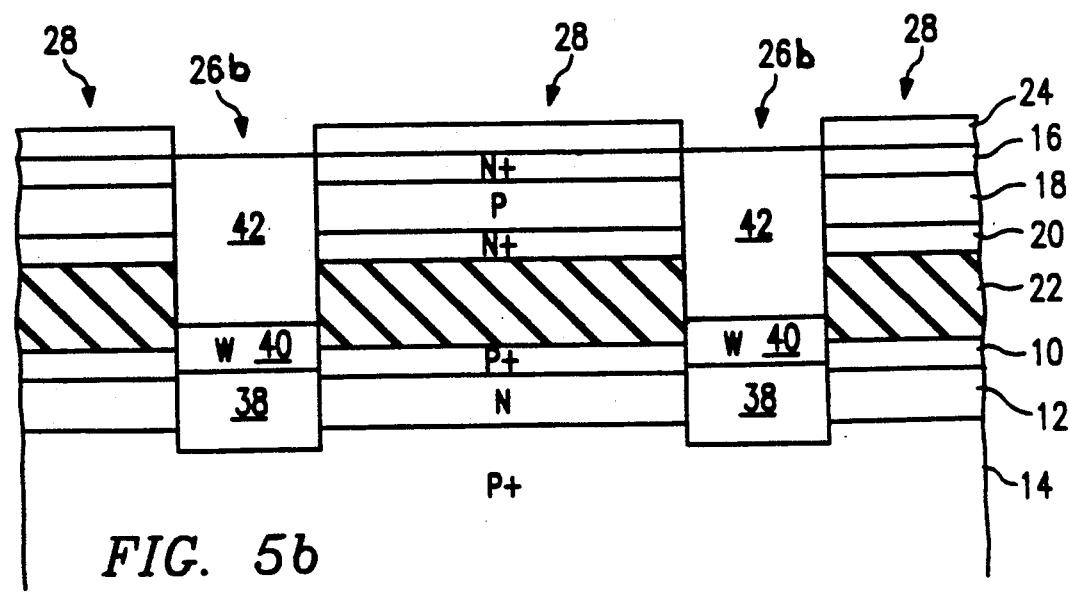
Figure 5C:
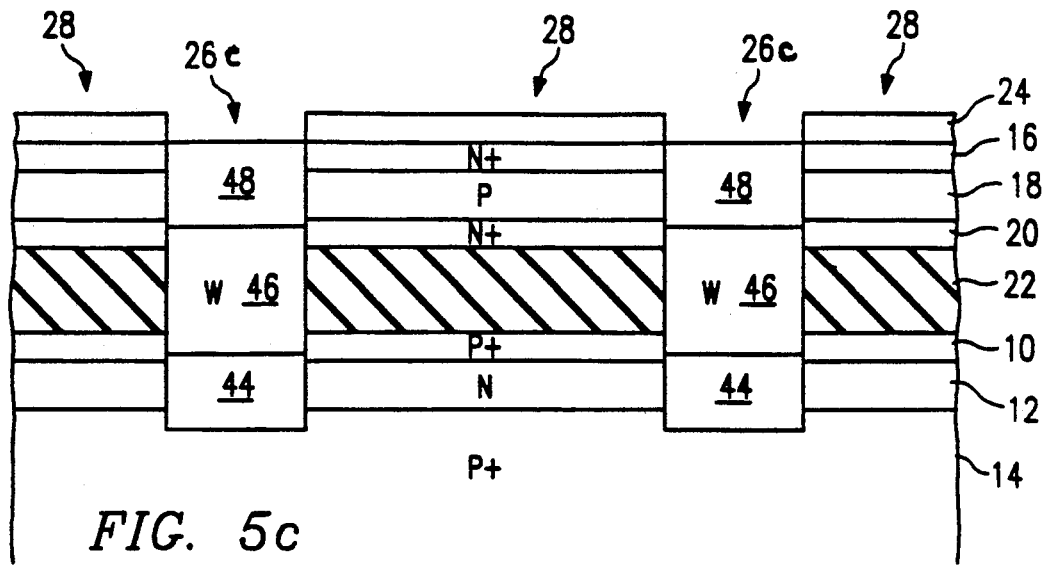

FIGS. 5a-c illustrate alternative structures for providing connections to the mesas 28. Two primary alternatives of the present invention combine the buried layer interconnects of FIGS. 5a and b (shown in trenches 26a and 26b) and combine the interconnects of FIGS. 5a and c (shown in trenches 26a and 26c). FIG. 5a illustrates a cross-sectional side view of the present invention wherein tungsten contacts are provided to the N+ layer 20 of a mesa 28. In this embodiment, the silicon dioxide layer 30 is etched back to provide plugs 32 which fill the trench to a level intermediate to the midlevel insulator 22. A buried lateral interconnect, shown as tungsten layer 34, or other conducting layer, is formed over the plugs 32 such that an electrical connection to the N+ layer 20 is provided. Insulating layer 36 is formed over the tungsten layer 34. For example, insulating layer 36 may be formed by a silicon dioxide deposition and etch back technique. It should be noted that whereas two trenches 26a are shown in this embodiment, only one trench is needed for the contact to the N+ layer 20. The other trench will be used to contact the gate of the transistors as illustrated in FIG. 6.

FIG. 5b illustrates a structure wherein the P+ layer 10 is contacted. In this structure, the insulating layer 30 is etched back to form plugs 38 which fill the trench to a level intermediate to the P+ layer 10. A buried lateral interconnect, shown as tungsten layer 40 is formed over the plugs 38 to provide a connection to the P+ layer 10, without contacting the N+ layer 20. An insulating layer 42 is formed over the tungsten layer 40 fill the trenches 26b. Once again, only a single contact 40 is needed to contact the P+ layer 10; the other trench may be used to provide a gate contact, as illustrated in FIG. 6, or may be completely filled with insulating material.

FIG. 5c illustrates a structure which connects the N+ and P+ layers 10 and 20 of the mesa 28. In this embodiment, plugs 44 are formed to a level intermediate to the P+ layer 20. A buried lateral interconnect, shown as tungsten layer 46 is formed such that the P+ layer 10 is electrically connected to the N+ layer 20. An insulating layer 48 is used to fill the remaining portions of the trenches 26c.

Figure 6:
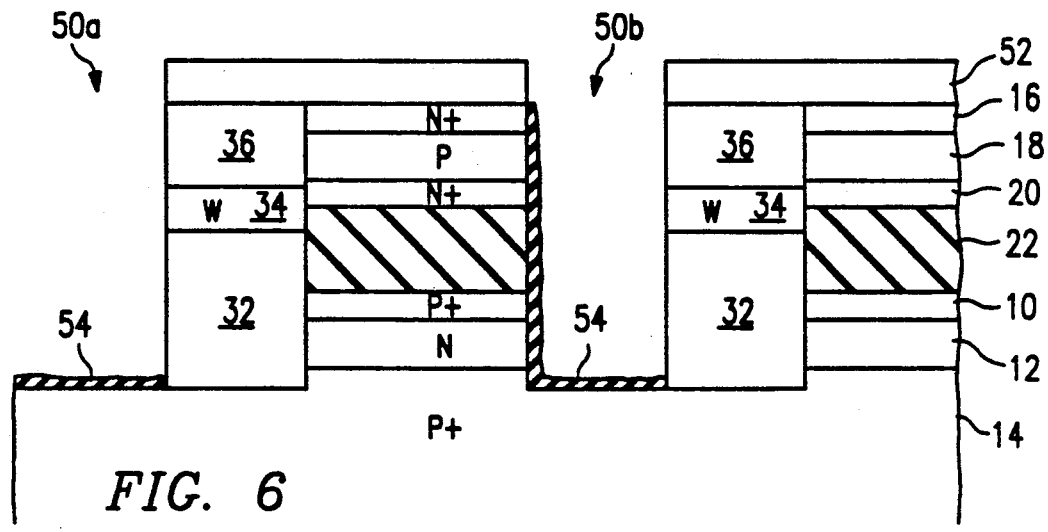
FIG. 6 illustrates a cross-sectional side view of the present invention after a sixth processing stage.

FIG. 6 illustrates the formation of a common gate region for the two vertical transistors comprising a mesa 28. This aspect of the invention is discussed in U.S. Pat. Nos. 4,740,826 and 4,810,906, referenced above. For purposes of illustration, the formation of the common gate is shown in connection the structure of FIG. 5a, which provides a connection to the N+ layer 20.

Trenches 50a and 50b are formed adjacent respective trenches 26a, using masking layer 52. The structure in FIG. 6 is subjected to a thermal oxidation process to form silicon dioxide layers 54 where silicon is exposed by the trenches 50a-b. The silicon dioxide layer 54 provides the gate insulation for the vertical transistors in the mesa 28.

Figure 7:
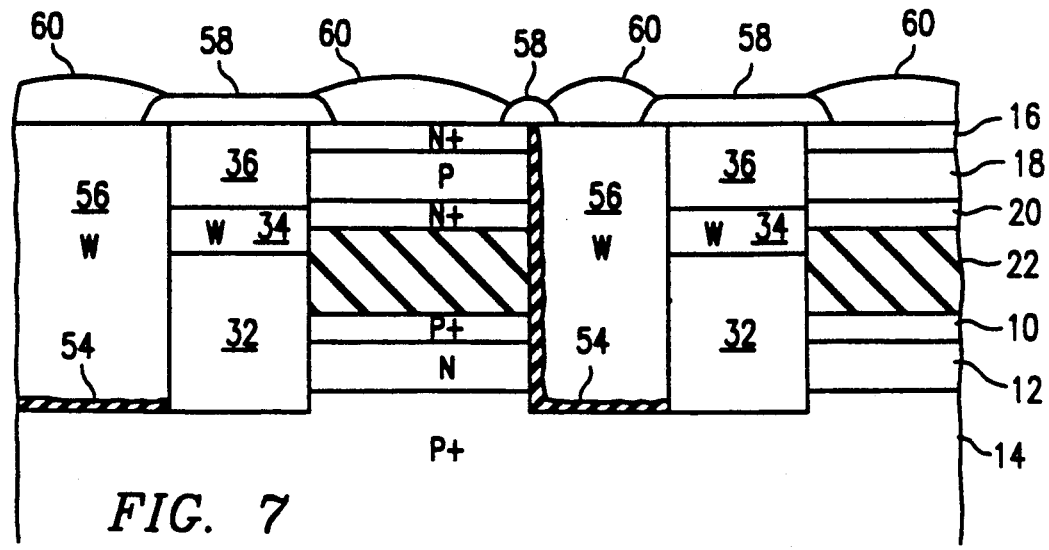
FIG. 7 illustrates a cross-sectional side view of the present invention after a seventh processing stage.

In FIG. 7, a cross-sectional side view of the present invention after a seventh processing stage. Conducting regions 56, typically formed from tungsten, are formed within the trench 50a-b. The tungsten conducting region 56 formed in trench 50a provides electrical contact to the adjacent plug 32 while the conducting region 56 formed in trench 50b provides the gate to the vertical transistors. Hence, the plug 32 adjacent the conducting region 56 formed in trench 50b provides a conducting path to an adjacent mesa, if desired.

Insulating regions 58 are formed over the filled trenches 26 and at the junction of the mesa 28 and the conducting region 56. Contacts 60 are formed on exposed portions of the structure. Complex structures may result in several interconnect levels providing electrical connections between the mesas 28 and conducting regions 56. Preferably, at least two layers of interconnects are used above the surface, but an alternative embodiment could vary from this requirement as necessary.

It should be noted that while the present invention shows a common gate for the two vertical transistors comprising the mesa, it is not necessary to use both transistors in the circuit path because the two interconnect types (26a and 26b or 26a and 26c) permit separate connections to each transistor.

Figure 8:
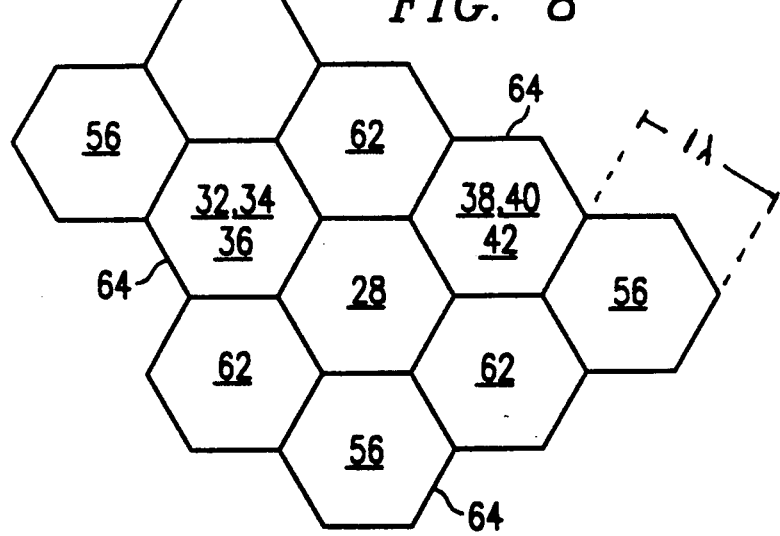
FIG. 8 illustrates a top plan view of one embodiment of the present invention using a honeycomb layout.

As shown in FIG. 8, the present invention is amendable to a hex-grid (honeycomb) layout which prevents lateral shorting of contacts to the semiconductor mesa 28. In FIG. 8, the semiconductor mesa 28 is surrounded by six regions. Insulation regions 62, which comprise trenches filled with insulating material, separate conducting regions 64 of the type illustrated in FIGS. 5a-c and 7. The hexagonal layout provides an efficient structure for a mesa surrounded by three conducting regions, one gate and two buried lateral interconnects. This structure provides an efficient configuration, since the size of each isolation region 62, conducting region 64 and mesa 28 may be as small as a single layout pixel.

While the present invention has been shown with the N-channel transistor disposed above the P-channel transistor, either transistor could be disposed above the other. However, providing the N-channel transistor on top provides the advantage that the N-channel devices will be more easily accessible, thereby facilitating the use of pseudo-NMOS structures in place of full CMOS structures.

In forming the midlevel insulator 22, two approaches could be taken. A relatively thick insulator may be provided, typically through oxide bonding, which would reduce parasitic capacitance and leakage through the insulator. Alternatively, a lower quality insulator may be treated by designers as a parasitic distributed conductance from layer 10 to layer 20 and may be isolated in areas where the conductance of the insulator loads the signal path. Use of a slightly leaky insulator avoids some floating node problems and may prevent the upper portion of the semiconductor mesas from holding a charge for long periods.

The present invention provides several advantages over the prior art. First, more complex structures may be designed, since the top and bottom transistors of each mesa are not connected. Second, the midlevel insulator provides processing control by providing an intermediate etch stop in the silicon etching steps such that the timed etch distance is cut in half. Third, the embodiment where the N-channel transistor is provided at the surface of the device facilitates use of pseudo-NMOS structures in the circuit design. Fourth, the structure is amendable to an efficient honeycomb layout which minimizes overall circuit size.

Although the present invention has been described in detail, it should be understood that various changes, substitutions and alterations can be made herein without departing from the spirit and scope of the invention as defined by the appended claims.

What is claimed is:

1. A complementary semiconductor device structure comprising:
    a substrate of a first conductivity type;
    a first channel layer of a second conductivity type formed on the surface of said substrate;
    a first source/drain layer of said first conductivity type formed on the surface of said first channel layer;
    an insulating layer formed on the surface of said first source/drain layer;
    a second source/drain layer of said second conductivity type formed on the surface of said insulating layer;
    a second channel layer of said first conductivity type formed on the surface of said second source/drain layer;
    a third source/drain layer of said second conductivity type formed on the surface of said second channel layer; and
    gate circuitry vertically disposed on an edge perpendicular to the plane of and adjacent to said first and second channel layers, and insulated therefrom.

2. The semiconductor structure of claim 1 and further comprising a conductive region connected to said first source/drain layer and insulated from said second source/drain layer.

3. The semiconductor structure of claim 1 and further comprising a conductive region connected to said second source/drain layer and insulated from said first source/drain layer.

4. The semiconductor structure of claim 1 and further comprising a conductive region connected to said first and second source/drain layers.

5. The semiconductor structure of claim 1 wherein said gate circuitry comprises:
    a first gate region defining a channel in said first conducting layer between said substrate and said first source/drain layer; and
    a second gate regions defining a channel in said second conducting layer between said second and third source/drain layers.

6. The semiconductor structure of claim 5 wherein said first conductivity type comprises P type conductivity and said second conductivity type comprises an N type conductivity type.

7. The semiconductor structure of claim 1 wherein said source/drain and channel layers are laterally isolated to define a hexagonal semiconductor mesa.

8. A semiconductor device comprising:
    a substrate;
    monocrystalline semiconductor mesas at the surface of the substrate;
    a first thin film conductive layer disposed below the surface of said mesas at a first predetermined depth to provide an electrical connection to predetermined ones of said mesas; and
    a second thin film conductive layer disposed below the surface of said mesas at a second predetermined depth to provide an electrical connection to predetermined ones of said mesas, said second contact electrically insulated from said first contact.

9. The semiconductor device of claim 8 wherein said mesa comprises first and second vertical transistors separated by an insulating layer.

10. The semiconductor device of claim 9 wherein said first contact is coupled to a source/drain of said first vertical transistor and said second source/drain is connected to a source/drain of said second vertical transistor.

11. The semiconductor device of claim 9 wherein said first vertical transistor comprises an N-channel transistor.

12. The semiconductor device of claim 11 wherein said second vertical transistor comprises a P-channel transistor.

13. The semiconductor device of claim 12 wherein said N-channel transistor is disposed above said P-channel transistor.

14. The semiconductor device of claim 8 wherein said mesa comprises a hexagonal-shaped mesa.

15. The semiconductor device of claim 14 wherein said first and second contacts comprise hexagonal-shaped contacts.

16. The semiconductor structure of claim 1, wherein said complimentary semiconductor device structure is connected in a circuit other than a CMOS inventor.

* * * * *